United States Patent
Smith

(10) Patent No.: US 6,255,180 B1
(45) Date of Patent: Jul. 3, 2001

(54) SEMICONDUCTOR DEVICE WITH OUTWARDLY TAPERED SIDEWALL SPACERS AND METHOD FOR FORMING SAME

(75) Inventor: Eugene C. Smith, Apple Valley, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/565,292

(22) Filed: May 1, 2000

Related U.S. Application Data

(62) Division of application No. 09/078,918, filed on May 14, 1998.

(51) Int. Cl.⁷ .................................................. H01L 21/336
(52) U.S. Cl. ............................................ 438/301; 438/303
(58) Field of Search .................................... 438/172, 167, 438/585, 659, 260, 301, 303

(56) References Cited

U.S. PATENT DOCUMENTS

| | | | | |
|---|---|---|---|---|
| 4,593,454 | * | 6/1986 | Baudrant et al. | 29/571 |
| 5,145,797 | * | 9/1992 | Nakanishi | 437/43 |
| 5,320,981 | * | 6/1994 | Blalock | 437/195 |
| 5,368,686 | * | 11/1994 | Tatsumi et al. | 156/656 |
| 5,439,831 | * | 8/1995 | Schwalke et al. | 437/24 |
| 5,496,747 | * | 3/1996 | Hong | 437/35 |
| 5,685,950 | * | 11/1997 | Sato | 156/643.1 |
| 5,795,793 | * | 8/1998 | Kinzer | 437/41 |
| 5,877,530 | * | 3/1999 | Aronowitz et al. | 257/344 |
| 5,960,269 | * | 9/1999 | Ristow et al. | 438/172 |
| 6,060,375 | * | 5/2000 | Owyang et al. | 438/585 |
| 6,165,845 | * | 12/2000 | Hsieh et al. | 438/260 |

\* cited by examiner

*Primary Examiner*—John F. Niebling
*Assistant Examiner*—Walter L. Lindsay, Jr.
(74) *Attorney, Agent, or Firm*—Kevin L. Daffer; Conley, Rose & Tayon P.C.

(57) ABSTRACT

The present invention advantageously provides a method for forming a nitride sidewall spacer having a relatively thin upper portion and a lower portion that increases in lateral thickness as it substantially tapers toward an underlying surface. In an embodiment, nitride sidewall spacers having this shape are formed upon the opposed sidewall surfaces of gate conductors which are dielectrically spaced above a semiconductor substrate. The upper portion of each spacer is bounded by a substantially vertical upper outer surface while the lower portion is bounded by a lower outer surface which is angled away from the upper outer surface. A unitary source/drain implant may be forwarded into the substrate to form graded junctions. The implant is self-aligned to the upper outer surfaces of the nitride spacers. As such, the graded junctions are displaced laterally from the gate conductors by a distance which is dictated by the lateral thickness of the upper portion of each spacer. The graded junctions include inner regions which are shallower than, and have a lower concentration of dopant than, outer regions spaced from the gate conductor by the lower portions of the spacers.

20 Claims, 5 Drawing Sheets

SEMICONDUCTOR DEVICE WITH OUTWARDLY TAPERED SIDEWALL SPACERS AND METHOD FOR FORMING SAME

This application is a division of Ser. No. 09/078,918 filed May 14, 1998.

BACKGROUND OF THE INVENTION

1. Field of the Invention

This invention relates to integrated circuit manufacturing and, more particularly, to sidewall spacers formed on opposed surfaces of a gate conductor and to a method for forming the sidewall spacers. The spacers can be produced by anisotropically etching a dielectric layer, preferably nitride, using a plasma provided with a carbon-containing species and absent of oxygen, thereby forming, e.g., a nitride sidewall spacer having a relatively thin upper portion and a lower portion that increases in thickness toward the base of the spacer.

2. Description of the Related Art

Fabrication of a multi-level integrated circuit involves numerous processing steps. After impurity regions have been formed within a semiconductor substrate and gate areas defined upon the substrate, interconnect routing is placed across the semiconductor topography and connected to the impurity regions. An interlevel dielectric is formed between the interconnect routing and the substrate to isolate the two levels. Contact areas are placed through the dielectric to electrically link the interconnect routing to select impurity regions extending across the substrate. A second level of interconnect routing may be placed across a second level of interlevel dielectric arranged above the first level of interconnect routing. The first and second levels of interconnect routing may be coupled together by contact structures arranged through the second level of interlevel dielectric. Additional levels of interconnect routing and interlevel dielectric may be formed, if desired.

Sidewall spacers are commonly formed laterally adjacent to the sidewall surfaces of structures arranged upon the semiconductor substrate. For example, during the fabrication of a MOS transistor upon and within the substrate, dielectric sidewall spacers are typically formed upon the opposed sidewall surfaces of a gate conductor spaced above the substrate by a gate dielectric. The presence of the sidewall spacers permit the formation of graded junctions (i.e., active areas) within the substrate on opposite sides of the gate conductor. The graded junctions are formed by first implanting a light concentration of dopant self-aligned to the sidewall surfaces of the gate conductor prior to forming the dielectric sidewall spacers. After the sidewall spacers have been formed, a heavier concentration of dopant self-aligned to the outer lateral surfaces of the spacers may be forwarded into the substrate. The purpose of the first implant is to produce lightly doped drain ("LDD") sections within the substrate that laterally straddle a channel region underneath the gate conductor. The second implant forms heavily doped source/drain regions within the substrate laterally outside the LDD areas. As a result of the second implant, the source/drain regions are laterally spaced from the channel region by a distance dictated by the thickness of the sidewall spacer and the diffusion length.

Together, the LDD areas and the source/drain regions form graded junctions which increase in dopant concentration in a lateral direction away from the gate conductor. During saturated operation of the ensuing transistor, the LDD areas serve to reduce the so-called maximum electric field, Em, which occurs proximate to the drain. Lowering Em affords protection against detrimental hot carrier effects ("HCE"). HCE is a phenomena by which the kinetic energy of the charge carriers (holes or electrons) is increased as they are accelerated through large potential gradients and subsequently become injected into and trapped within the gate dielectric. As a result of trapped charge accumulating over time in the gate dielectric, an undesirable shift in the threshold voltage, $V_T$, of the transistor may occur.

FIG. 1 illustrates the formation of a pair of series-connected MOS transistors 4 and 6. Series-connected transistors 4 and 6 may be implemented in, e.g., an SRAM memory device. Gate conductors 12 which comprise doped polysilicon are spaced above a semiconductor substrate 10 by a gate dielectric 11. A dielectric layer 14 composed of, e.g., silicon nitride ("nitride") may be arranged across each gate conductor 12 Nitride ($Si_3N_4$) sidewall spacers 16 extend laterally from the opposed sidewall surfaces of gate conductors 12. LDD areas 20 are positioned within substrate 10 directly beneath sidewall spacers 16. Source/drain regions 18 are arranged within substrate 10 laterally adjacent LDD areas 20. One of the source/drain regions 18 may be laid out common to both transistor 4 and transistor 6 if, for example, the transistor pairs are coupled in series, or possibly in parallel. The outer surface of each sidewall spacer 16 is substantially perpendicular with the horizontal surface of substrate 10. Placing LDD areas 20 below, and directly adjacent to, gate conductors 12 can unfortunately lead to short channel effects ("SCE"). The distance between the source-side junction and the drain-side junction is often referred to as the physical channel length. However, during subsequent annealing steps, the dopant species within LDD areas 20 may migrate laterally under gate conductors 12. As a result of the lateral migration, the actual distance between the source-side and drain-side junctions becomes less than the physical channel length and is often referred to as the effective channel length ("Leff"). Problems associated with SCE, e.g., subthreshold currents, become a factor whenever Leff drops below approximately 1.0 μm.

The vertical orientation of the outer surfaces of sidewall spacers 16 is a result of the etch technique used to define the spacers. Nitride sidewall spacers 16 are formed by depositing a nitride layer across substrate 10 and gate conductors 12, allowed by anisotropically etching the nitride layer using a dry, plasma etch technique. The nitride layer may have a thickness of, e.g., 500 Å. A plasma provided with a halocarbon gas, e.g., $CF_4$ and with $O_2$ is generated within a reactive-ion etching ("RIE") reactor during the etch step. It is believed that carbon-containing and oxygen-containing radicals created in the plasma react to form volatile compounds of, e.g., CO. Also, excited F atoms adsorb upon the surface of the nitride layer where they may react with $Si_3N_4$ to form volatile compounds, such as $SiF_4$. Ions produced in the plasma, being vertically directed, strike the horizontally oriented surfaces of the nitride layer, enhancing the reaction rate at those surfaces and/or the desorption rate of compounds from those surfaces. As such, nitride sidewall spacers 16 which have a lateral thickness similar to that of the originally deposited nitride layer are retained exclusively laterally adjacent to the opposed sidewall surfaces of gate conductors 12.

FIG. 1 also depicts an interlevel dielectric 22 arranged across transistors 4 and 6. An ohmic contact 24 has been formed vertically through interlevel dielectric 22 to mutual source/drain region 18. Contact 24 is interposed between a pair of adjacent spacers 16, one of which belongs to transistor 4, and the other of which belongs to transistor 6. This pair of adjacent spacers 16 have been formed at relatively short distance apart to afford high packing density of transistors 4 and 6. In fact, the lateral distance between the pair of adjacent spacers 16 of transistors 4 and 6 may be less than the minimum definable feature size of optical lithography. Contact 24 is preferably self-aligned between spacers 20 associated with transistors 4 and 6. Accordingly, contact 24 is noted herein as a self-aligned contact, and is formed by first lithographically patterning a masking layer (i.e., photoresist) upon regions of interlevel dielectric 22 exclusive of the area to be occupied by contact 24. The minimum lateral width of the area of interlevel dielectric 22 not covered by the masking layer is thus limited by the constraints of lithography. That exposed area of interlevel dielectric 22 is etched using an etch technique which is highly selective to the interlevel dielectric material, e.g., silicon dioxide, relative to nitride.

As a result of the etch step, an opening (or via) having an upper portion wider than a lower portion is formed through interlevel dielectric 22. The upper portion of the opening is mandated by the minimum feature size of lithography. The lower portion is dictated by the distance between the pair of adjacent nitride spacers 20 since the spacers are not significantly removed by the selective etch process. Unfortunately, the resistance of contact 24 is greater than desired since the area occupied by contact 24 directly between the pair of adjacent nitride spacers 20 is relatively small. Although decreasing the lateral thickness of nitride sidewall spacers 16 would increase the amount of area filled by contact 24, doing so would undesirably sacrifice the benefits of having LDD areas 20. That is, decreasing the lateral thickness of nitride spacers 16 would lead to a reduction in the lateral widths of LDD areas 20. Consequently, source/drain regions 18 might not be adequately spaced from gate conductor 12 to provide for sufficient protection against hot carrier injection into gate dielectric 11.

It would therefore be of benefit to develop a method for reducing the resistance of a contact formed to a mutual implant region of a pair of closely spaced transistors. That is, the distance between the nitride sidewall spacers placed on proximally spaced gate conductors must be increased. The area of the contact between those spacers should somehow be increased to afford lower resistance of the contact. It would also be desirable to lower the possibility of short channel effects. As such, it is necessary to provide some leeway between the LDD areas and the gate conductors so that dopant species have farther to migrate before reaching the regions of the substrate directly below the gate conductors. The LDD areas must therefore be formed laterally within the substrate, and removed from the gate conductors.

SUMMARY OF THE INVENTION

The problems outlined above are in large part solved by the technique hereof for forming a sidewall spacer having a relatively thin upper portion and a lower portion that increases in lateral thickness as it substantially tapers toward an underlying surface. In an embodiment, the spacer comprises nitride which is tapered upon the opposed sidewall surfaces of gate conductors which are dielectrically spaced above a semiconductor substrate. The gate conductors may belong to a pair of series-connected transistors such as those found in logic blocks or in memory (e.g., SRAM) cells. The upper portion of each spacer is bounded by a substantially vertical upper outer surface while the lower portion is bounded by a lower outer surface which is angled away from the upper outer surface. A unitary source/drain implant may be forwarded into the substrate to form graded junctions. The implant is self-aligned to the upper outer surfaces of the nitride spacers. As such, the graded junctions are displaced laterally from the gate conductors by a distance which is dictated by the lateral thickness of the upper portion of each spacer. Therefore, the possibility of the dopant species within the junctions migrating laterally underneath the gate conductors during subsequent annealing steps is reduced. The spacing between each graded junction and the gate conductor nearest to the junction permits diffusion of the dopant species without being concerned that SCE might occur.

The lower portion of each spacer includes a tapered region which extends laterally beyond the upper outer surface. Atoms within those tapered regions block the pathways of some of the dopant species forwarded to the topography. Therefore, some dopant species passing through those tapered regions never reach the substrate. Further, the energy of the dopant species that reach the substrate is significantly reduced. As such, the graded junctions include inner regions which are shallower than, and have a lower concentration of dopant than, outer regions spaced from the gate conductor by the lower portions of the spacers. Therefore, the presence of the tapering lower portions of the nitride spacers affords formation of lightly doped areas within the junctions. The upper portion of each nitride spacer may thus have a relatively small lateral thickness, e.g., 250 Å, that is less than that of the lower portion. As such, the distance between a pair of adjacent spacers belonging to different transistors may be increased by decreasing the lateral thickness of the upper portions of the nitride spacers. Increasing the distance between the pair of adjacent spacers affords decreased resistance of a contact subsequently formed to a mutual junction of the two transistors. That is, the contact has more space to occupy between the pair of adjacent spacers.

According to an embodiment, the sidewall spacers are formed by first depositing a nitride layer across a topography in which a pair of gate conductors are laterally spaced apart upon a semiconductor topography. A dielectric layer, e.g., nitride, may be arranged upon each of the gate conductors. Each gate conductor is laterally bounded by a pair of opposed sidewall surfaces. The nitride layer is then anisotropically etched using a plasma provided with a carbon-containing species, e.g., $CHF_3$, and absent of oxygen. A fluorocarbon that readily etches nitride, e.g., $C_2F_6$, is also provided to the plasma The excited carbon atoms, having no oxygen to react with, become deposited across the nitride layer where they form a nonvolatile film. The nonvolatile film serves as a "passivant" in that it protects the topological surface upon which it resides from exposure to species, such as ions. Ion bombardment of the passivant residing upon horizontally oriented surfaces removes the passivant to permit excited F atoms to be adsorbed onto the underlying nitride layer. As the excited F atoms are bombarded by ions, they react with the $Si_3N_4$ to form volatile species, e.g., $SiF_4$, resulting in the removal of the nitride layer. Absent significant ion ablation of vertically oriented surfaces, the passivant is primarily retained upon substantially vertical surfaces which extend parallel to the ion bombardmant.

It is believed that ions may strike sloping surfaces of the nitride layer more frequently than vertical surfaces and less frequently than horizontal surfaces of the nitride layer. Those sloping surfaces are neither perpendicular to nor parallel to the upper surface of the substrate. The vertically-directed ions striking the vertical surfaces may be deflected toward those sloping surfaces. Thus, the passivant upon those sloping surfaces is removed at a slower rate than the passivant upon horizontal surfaces. Accordingly, the etch rate of those sloping surfaces is greater than the etch rate of vertical surfaces and less than the etch rate of horizontal surfaces. It is believed that those sloping surfaces of the nitride layer become the tapering lower portions of the nitride sidewall spacers. Also, the vertical surfaces of the nitride layer form the upper portions of the spacers, while the horizontal surfaces are completely removed down to the underlying substrate.

Subsequent to forming the sidewall spacers, dopant species are implanted into the topography. The implant forms graded junctions within the substrate which are laterally spaced from the gate conductors by the lateral thickness of the upper portions of the spacers. One of the graded junctions may be shared by a pair of series-connected transistors. A relatively thin layer of nitride may then be deposited across the topography. Thereafter, an interlevel dielectric is deposited across the topography to a level spaced above the transistors, and then planarized using, e.g., chemical-mechanical polishing ("CMP"). A portion of the interlevel dielectric spaced above the mutual junction is etched using an etch technique which has a high selectivity ratio of the interlevel dielectric material to the spacer material, e.g., nitride. The etch is terminated after a portion of the interlevel dielectric not covered by photoresist is etched to the nitride layer residing upon the mutual junction. Exposed portions of the nitride spacers and the nitride layer are then removed using an etch technique which is highly selective to nitride relative to silicon, i.e., the substrate material. A conductive material, e.g., tungsten or titanium, may then be deposited into the opening to form a contact of relatively low resistivity coupled to the mutual junction.

BRIEF DESCRIPTION OF THE DRAWINGS

Other objects and advantages of the invention will become apparent upon reading the following detailed description and upon reference to the accompanying drawings in which.

Figure 1:
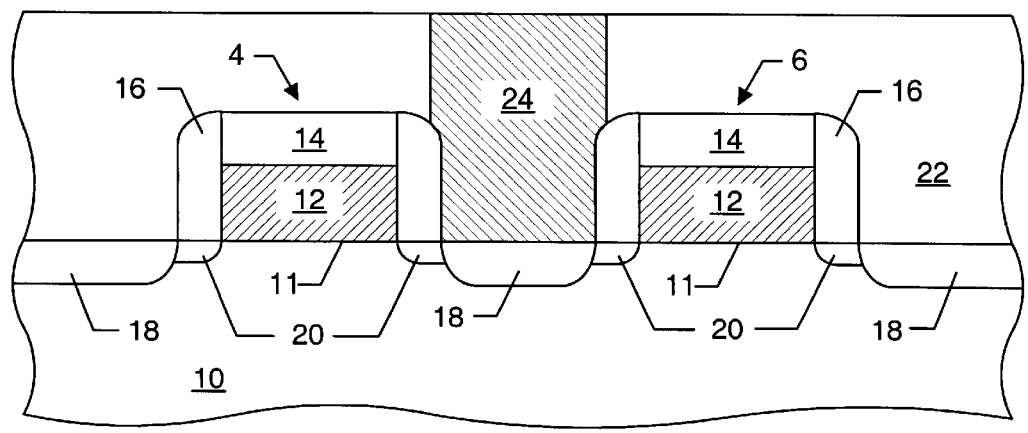
FIG. 1 is a partial cross-sectional view of a semiconductor topography according to a conventional design, wherein nitride sidewall spacers extending laterally from the opposed sidewall surfaces of a pair of gate conductors have substantially vertical outer surfaces.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
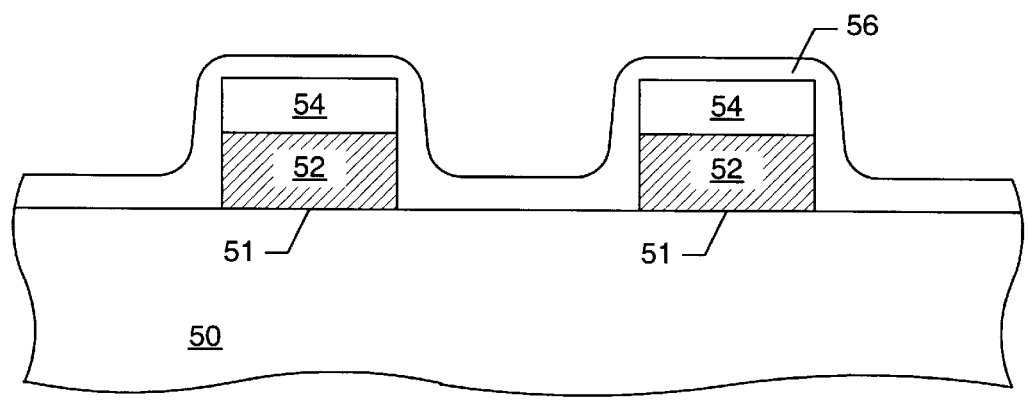
FIG. 2 is a partial cross-sectional view of a semiconductor topography according to an embodiment of the present invention, wherein a nitride layer is deposited across exposed surfaces of a semiconductor substrate and a dielectric layer is arranged across a gate conductor that is dielectrically spaced above the substrate.

Turning now to FIG. 2, a nitride layer 56 is deposited across a topography using, e.g., low pressure chemical-vapor deposition ("LPCVD") from, e.g., a $N_2$- and silane-bearing source gas. Using LPCVD to deposit nitride layer 56 ensures that a stoichiometric nitride ($Si_3N_4$) is formed. The topography across which nitride layer 56 is deposited includes a semiconductor substrate 50 comprising single crystalline silicon which has been lightly doped with p-type or n-type species. Although not shown, field isolation regions may be arranged spaced distances apart within substrate 50 to isolate ensuing active regions. A pair of gate conductors 52 are spaced laterally apart upon substrate 50. A gate dielectric 51 is interposed between each gate conductor 52 and the underlying substrate 50. Also, a layer of nitride 54 may be arranged across each gate conductor 52 to electrically isolate the upper surface of gate conductor 52. The thickness of nitride layer 56 is preferably less than that of a conventional spacer, e.g., 250 Å.

Figure 3:
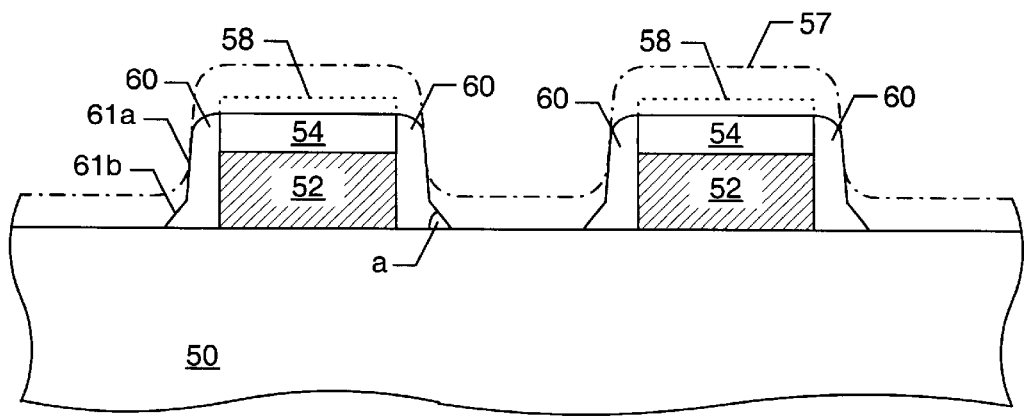
FIG. 3 is a partial cross-sectional view of the semiconductor topography, wherein the nitride layer is anisotropically etched using a plasma provided with a carbon source and absent of oxygen to form nitride sidewall spacers having tapering lower portions upon the opposed sidewall surfaces of the gate conductor/dielectric layer structures, subsequent to the step in FIG. 2.

FIG. 3 illustrates the formation of nitride sidewall spacers 60 laterally extending from the opposed sidewall surfaces of the gate dielectric 52/layer of nitride 54 structures. Nitride sidewall spacers 60 are formed by anisotropically etching nitride layer 56 using a plasma provided with a carbon-containing species, e.g., $CHF_3$, $C_2H_2F_4$, and/or a fluorocarbon, e.g., $C_2F_6$. Dotted line 57 indicates the upper boundary of nitride layer 56 before removing a substantial portion of the nitride layer. Dotted line 58 presents the upper surface of the layer of nitride 54 prior to performing the anisotropic etch step. The etch duration is terminated after the only remaining nitride is that of nitride sidewall spacers 60. An upper portion of each nitride spacer 60 has a substantially vertical upper outer surface 61a. A lower portion of each nitride spacer 60 has a lower outer surface 61b which substantially tapers away from the upper outer surface 61a. An angle a which is greater than about 20° and less than about 70° thus exists between lower outer surface 61b and the upper surface of substrate 50. It is believed that the gas flow rate ratio of $CHF_3$ to $C_2F_6$ entering the etch reactor may be controlled to manipulate the angle a. For example, to achieve a 45° angle between the upper surface of substrate 50 and lower outer surface 61b of nitride sidewall spacer 60, the ratio of $CHF_3$ to $C_2F_6$ may be 1.5. It is believed that angle a may be increased by increasing the $CHF_3:C_2F_6$ ratio and that angle a may be decreased by decreasing the $CHF_3:C_2F_6$ ratio. The upper portion of each nitride sidewall spacer 60 has a substantially uniform lateral thickness of, e.g., about 250 Å. The lower portion of each nitride sidewall spacer 60 increases e.g., from about 250 Å to about 500 Å, as it approaches the upper surface of substrate 50. Nitride sidewall spacers 60 combined with layer of nitride 54 encapsulate gate conductors 52 so that the gate conductors are electrically isolated from other structures.

Figure 4:
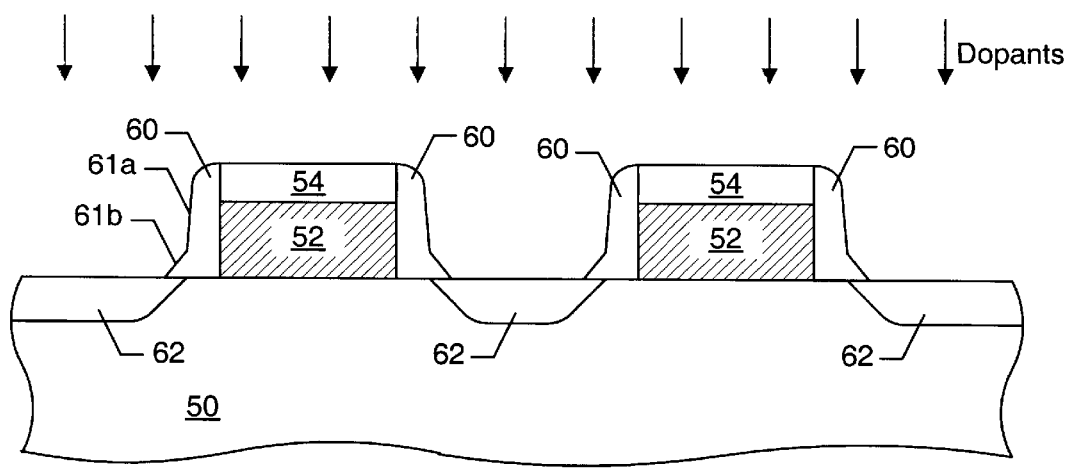
FIG. 4 is a partial cross-sectional view of a semiconductor topography, wherein dopant species are implanted into regions of the substrate to form graded junctions laterally spaced from the gate conductor, subsequent to the step in FIG. 3.

Turning to FIG. 4, dopant species are then implanted into regions of substrate 50 to form graded junctions 62 laterally spaced from gate conductors 52. N-type species may be implanted if NMOS transistors are being formed, and p-type species may be implanted if PMOS transistors are being formed. Some commonly used p-type species are boron and boron difluoride, and some commonly used n-type species are arsenic and phosphorus. The implant is self-aligned to upper outer surfaces 61a and 61b of nitride sidewall spacers 60. Accordingly, each graded junction is spaced from a sidewall surface of an adjacent gate conductor 52 by a distance substantially equivalent to the lateral thickness of the upper portion of the nitride spacer 60 extending from that lateral sidewall surface. An outer portion of each graded junction 62 is spaced from an adjacent gate conductor 52 by the thickness of the base of the adjacent nitride spacer 60. An inner portion of each graded junction 62 is thus aligned between upper outer sidewall 61a and the outer portion of that junction. Therefore, the inner portion of each graded junction 62 is overshadowed by a tapering region of the lower portion of the overlying nitride spacer 60. The dopant species implanted into the inner portions of graded junctions 62 thus pass through the tapering portions of nitride spacers 60 before entering substrate 50. On the other hand, the dopant species implanted into the outer portions of graded junctions 62 are forwarded directly into substrate 50, and experience no obstructions to their pathways. As such, the inner portions of graded junctions 62 have a lower concentration of dopant than the outer portions. Further, the inner portions increase in depth as they approach the outer portions, and are thus shallower than the outer portions. As shown, the entire graded junction (source/drain and LDD areas) is formed during a single implant step. One of the graded junctions 62 may be shared between a pair of series-connected transistors. The mutual graded junction 62 is thus interposed between nitride spacers 60 of different transistors. Subsequently, substrate 50 may be subjected to a post-implant anneal to activate and position the as-implanted species. If desired, a silicide may then be formed on the exposed, silicon-based surfaces.

Figure 5:
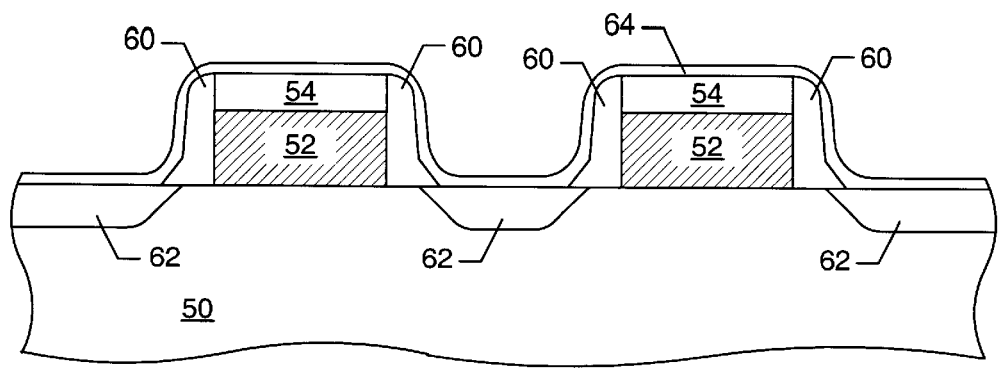
FIG. 5 is a partial cross-sectional view of a semiconductor topography, wherein a relatively thin nitride layer is deposited across the topography, subsequent to the step in FIG. 4.
Figure 6:
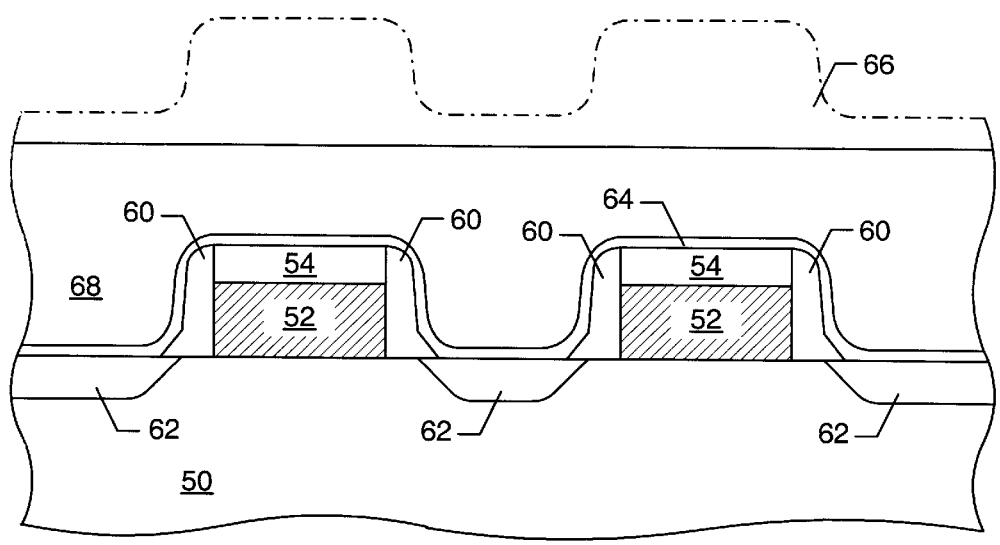
FIG. 6 is a partial cross-sectional view of a semiconductor topography, wherein an interlevel dielectric is deposited across the nitride layer to a level spaced above the gate conductor/dielectric layer structures, subsequent to the step in FIG. 5.
Figure 7:
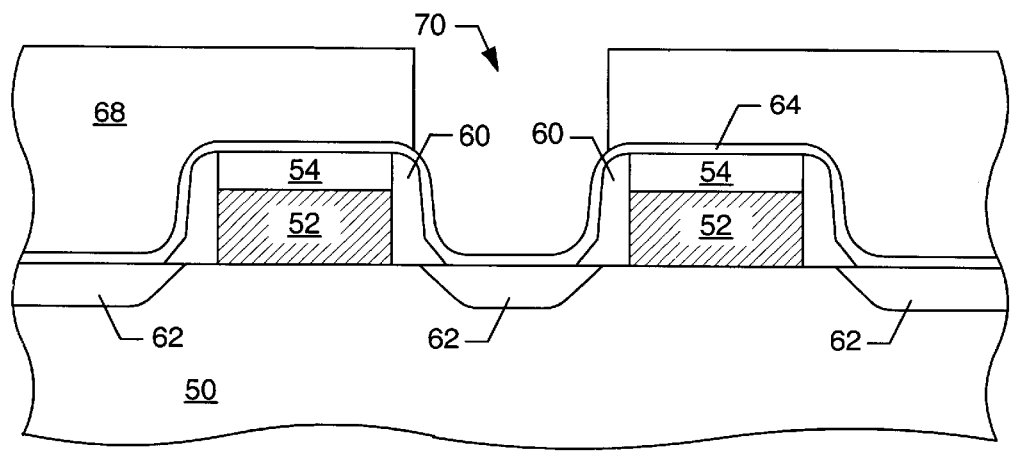
FIG. 7 is a partial cross-sectional view of a semiconductor topography, wherein an opening is etched through the inter-level dielectric to the nitride layer residing upon a graded junction mutually shared by two transistors, subsequent to the step in FIG. 6.

As shown in FIG. 5, a relatively thin layer of nitride 64 may be CVD deposited across the semiconductor topography. The thin layer of nitride 64 may subsequently serve as an etch stop layer. As depicted in FIG. 6, an interlevel dielectric 68 composed of, e.g., an oxide- or glass- based material is formed across the thin layer of nitride 64. Formation of interlevel dielectric 68 involves first depositing the dielectric to a level spaced above the gate conductor 52/nitride 54 structures. A portion 66 of the dielectric is then removed using, e.g., CMP or sacrificial etchback, thereby planarizing the upper surface of the resulting interlevel dielectric 68. FIG. 7 illustrates the formation of a contact opening 70 (or via) through a portion of interlevel dielectric 68 interposed between nitride spacers 60 of different transistors. Although not shown, a photoresist film is lithographically patterned above portions of interlevel dielectric 68 exclusive of where contact opening 70 is to be formed. An uncovered portion of interlevel dielectric 68 is then etched using an etch technique which exhibits a high selectivity for the interlevel dielectric material relative to nitride. Thus, even if the area of interlevel dielectric uncovered by the photoresist is larger than the distance laterally between nitride spacers 60, nitride layer 60 is not significantly etched. The etch duration is chosen to terminate after the uncovered portion of interlevel dielectric 68 has been removed down to the thin layer of nitride 64 residing upon mutual graded junction 62.

Figure 8:
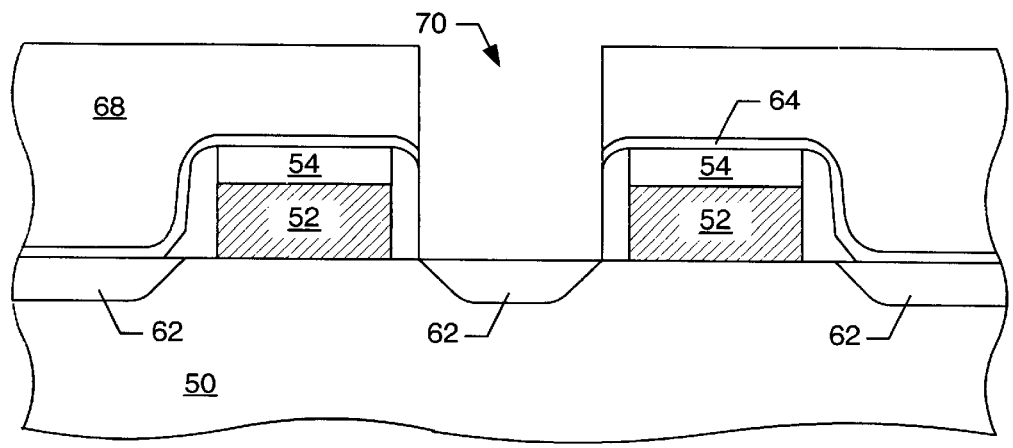
FIG. 8 is a partial cross-sectional view of a semiconductor topography, wherein portions of the nitride layer and the nitride sidewall spacers interposed between the lateral boundaries of the opening are etched to the substrate, subsequent to the step in FIG. 7.
Figure 9:
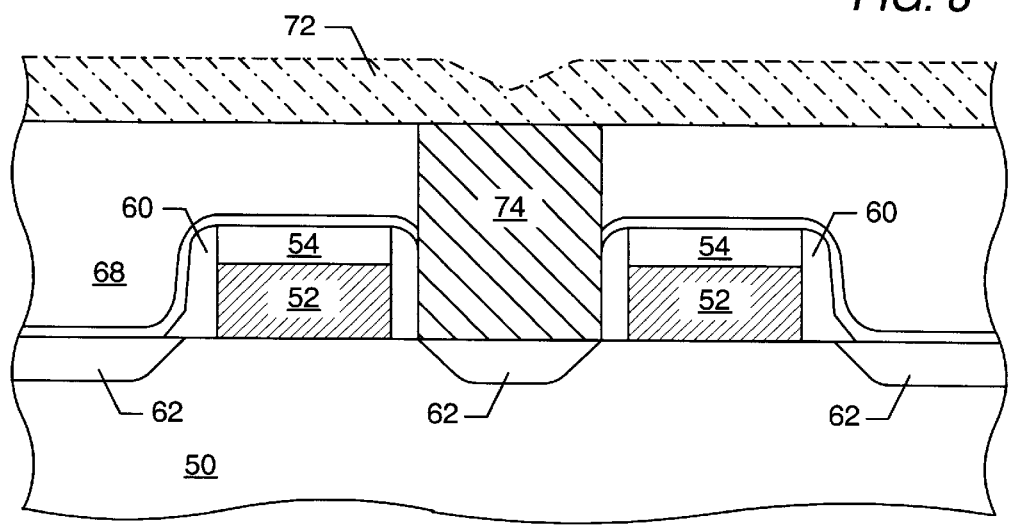
FIG. 9 is a partial cross-sectional view of a semiconductor topography, wherein a conductive contact is formed within the opening, subsequent to the step in FIG. 8.

Turning to FIG. 8, another etch technique is then performed to remove a portion of nitride layer 64 and portions of nitride spacers 60 interposed between the opposed lateral boundaries of contact opening 70. The etchant used is fairly directional and highly selective to nitride, as opposed to oxide. In this manner, the upper surface of mutual graded junction 62 is exposed. As shown in FIG. 9, a conductive material e.g., tungsten or titanium, may then be deposited by, e.g., sputter deposition, into contact opening 70 and across interlevel dielectric 68. A portion 72 of the conductive material is then removed using, e.g., CMP, to a level substantially coplanar with the upper surface of interlevel dielectric 68, thereby forming a contact (or plug) vertically through interlevel dielectric 68 to mutual junction 62.

Figure 10:
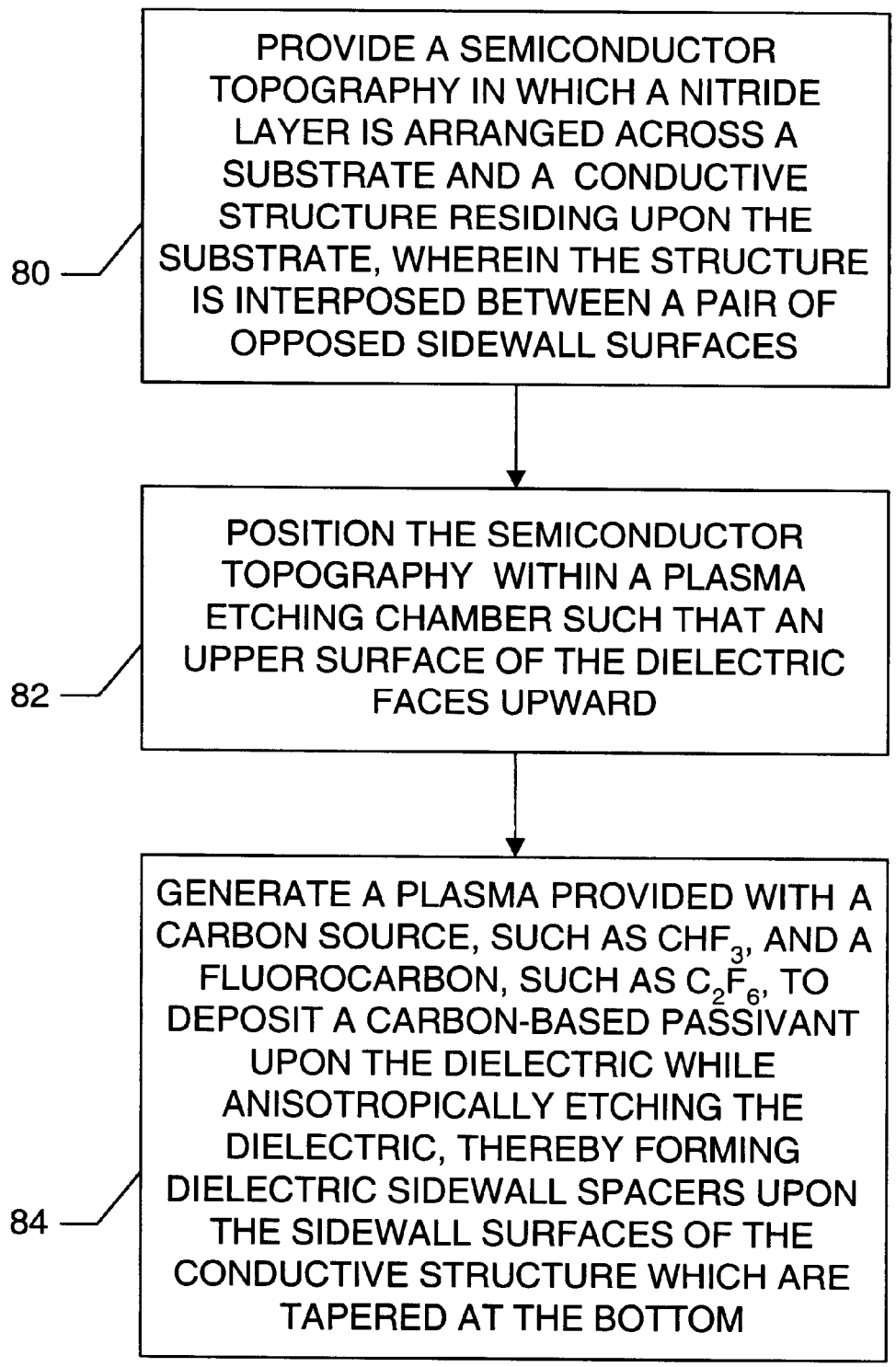
FIG. 10 is a process flow diagram of the steps employed to form nitride sidewall spacers.

FIG. 10 depicts a process flow diagram of the steps involved in forming nitride sidewall spacers with the shape of the nitride sidewall spacers 60 depicted in FIG. 4. Block 80 illustrates that a semiconductor topography is first provided which includes a conductive structure (e.g., gate conductors) interposed between a pair of opposed sidewall surfaces and arranged upon a substrate. A nitride layer is arranged across the semiconductor topography. As shown in block 82, the semiconductor topography is positioned within a plasma etching chamber, preferably an RIE chamber, such that an upper surface of the topography faces upward. As shown in block 84, a plasma provided with a carbon source gas, such as $CHF_3$, and a fluorocarbon gas, such as $C_2F_6$, is then generated within the chamber. The plasma is deliberately left absent of oxygen. The RIE chamber may include an rf diode configuration to permit the formation of such a plasma. That is, the plasma may be formed between a powered electrode to which an rf power is applied and a grounded electrode. The powered electrode and grounded electrode are oriented parallel to each other.

It is postulated that excited carbon atoms within the plasma adsorb on the surface of the nitride layer since they have no oxygen with which to bond. In this manner, a carbon-based passivant becomes deposited across the nitride layer. It is believed that such a passivant readily forms upon nitride. Concurrent with the deposition of the passivant, ion ablation of horizontally oriented surfaces of the topography occurs at a faster rate than vertically oriented surfaces (i.e., anisotropically). As such, the passivant upon the horizontal nitride surfaces are constantly bombarded while the passivant upon vertical nitride surfaces are bombarded less frequently. The passivant upon non-vertically sloped surfaces are also bombarded at a slower rate than the passivant upon horizontal surfaces and at a faster rate than the passivant upon vertical surfaces. In addition to the deposition and ion bombardment of the passivant, excited fluorine atoms become adsorbed onto the topography. However, the presence of the passivant upon the vertical surfaces of the nitride layer inhibits the fluorine atoms from contacting and reacting with those vertical surfaces. Since the passivant is removed from horizontal surfaces and sloping surfaces, the fluorine atoms are able to react with the nitride at those surfaces to form volatile species. As such, horizontal surfaces of the nitride layer are etched at a faster rate than sloping surfaces of the nitride, which are etched at a faster rate than vertical surfaces of the nitride. As a result of the different etch rates of the nitride, nitride sidewall spacers are retained upon the opposed sidewall surfaces of the conductive structure which are tapered at the bottom.

It will be appreciated to those skilled in the art having the benefit of this disclosure that this invention is believed to provide a method for anisotropically etching a nitride layer using a plasma provided with a carbon-containing species and absent of oxygen, thereby forming a nitride sidewall spacer having a relatively thin upper portion and a lower portion that increases in lateral thickness as it approaches an underlying surface. Such a nitride sidewall spacer may be formed laterally adjacent to any vertically extending sidewall surface of a semiconductor topography. However, a nitride sidewall spacer may be particularly useful if configured upon the sidewall surface of a gate conductor of, e.g., an SRAM device. Further modifications and alternative embodiments of various aspects of the invention will be apparent to those skilled in the art in view of this description. The materials in the above example were only mere examples and may be substituted with other materials. It is intended that the following claims be interpreted to embrace all such modifications and changes and, accordingly, the specification and drawings are to be regarded in an illustrative rather than a restrictive sense.

What is claimed is:

1. A method, comprising:
    etching a portion of a dielectric adjacent to a spacer selectively relative to a layer immediately beneath the dielectric, said spacer comprising a nitride and being adjacent to a sidewall of a transistor gate structure, wherein the spacer includes a lower portion and an upper portion each having respective lower and upper outer surfaces, and the lower outer surface tapers away from the transistor gate structure by an angle greater than that by which the upper outer surface tapers away from the transistor gate structure; and subsequently
    etching at least part of the lower portion of the spacer.

2. The method of claim 1, wherein the upper outer surface extends from the top of the sidewall spacer and the lower outer surface extends from the upper outer surface to the bottom of the sidewall spacer, and the spacer tapers over substantially its entirety.

3. The method of claim 2, wherein said etching a portion of the spacer reduces the angle by which the lower outer surface tapers away from the transistor gate structure.

4. The method of claim 3, wherein the layer immediately beneath the dielectric is an etch stop layer arranged above the sidewall spacer and a junction region of a semiconductor substrate, and said etching a portion of the dielectric comprises etching the dielectric selectively relative to the etch stop layer.

5. The method of claim 4, wherein the dielectric comprises silicon dioxide and the etch stop layer comprises silicon nitride, and wherein said etching a portion of the dielectric further comprises etching the dielectric using an etching technique selective to silicon dioxide over silicon nitride.

6. The method of claim 5, wherein said etching a portion of the sidewall spacer comprises etching a portion of the etch stop layer using an etching technique selective to silicon nitride over silicon.

7. The method of claim 2, wherein after said etching a portion of the sidewall spacer is complete, a portion of the sidewall spacer remains adjacent to the transistor gate structure.

8. The method of claim 2, wherein said etching a portion of the dielectric exposes a portion of the layer immediately beneath the dielectric.

9. The method of claim 2, further comprising prior to said removing a portion of an dielectric:
    blanket depositing a spacer dielectric layer upon the transistor gate structure, wherein the transistor gate structure is dielectrically spaced above the semiconductor substrate; and
    exposing the spacer dielectric layer to a carbon-based etchant to form the sidewall spacer.

10. The method of claim 9, wherein the spacer dielectric layer comprises silicon nitride, wherein said exposing comprises etching the spacer dielectric layer using a plasma provided with $CHF_3$ and $C_2F_6$, and wherein the plasma is absent externally supplied $O_2$.

11. The method of claim 9, wherein said etching the spacer dielectric layer while exposing the spacer dielectric layer to a carbon-based etchant causes a carbon-containing passivant to deposit across the spacer dielectric layer.

12. The method of claim 9, further comprising forming the dielectric above the transistor gate structure subsequent to said exposing the spacer dielectric layer to a carbon-based etchant.

13. The method of claim 9, wherein the sidewall spacer is formed such that the lower portion increases in thickness as it approaches the substrate and the upper portion has a substantially uniform thickness, and further comprising forwarding a source/drain implant into the substrate self-aligned to the upper outer surface of the sidewall spacers, thereby forming a graded junction within the substrate laterally spaced from the transistor gate structure.

14. The method of claim 13, wherein the graded junction comprises an inner portion arranged underneath the sidewall spacers and an outer portion laterally adjacent to the inner portion, and wherein a first concentration of dopant within the outer region is substantially greater than a second concentration of dopant within the inner region.

15. A method, comprising:
    forming an dielectric above a pair of adjacent transistor gate structures dielectrically spaced above a semiconductor substrate, wherein sidewall spacers comprising silicon nitride are arranged adjacent the sidewalls of each of the transistor gate structures, wherein the sidewall spacers each include lower portions and upper portions having lower and upper outer surfaces, respectively, and wherein, for each of the sidewall spacers, the upper outer surface extends from the top of the sidewall spacer, the lower outer surface extends from the upper outer surface to the bottom of the sidewall spacer, and the lower outer surface tapers away from the transistor gate structure by an angle greater than that by which the upper outer surface tapers away from the structure and tapers over substantially its entirety;
    etching a portion of the dielectric above a mutual graded junction arranged within the semiconductor substrate between the pair of adjacent transistor gate structures and at least partially beneath a sidewall spacer of each of the pair of adjacent transistor gate structures, wherein said etching a portion of the dielectric etches the dielectric selectively relative to a layer immediately beneath the dielectric; and subsequently etching at least part of the lower portions of the sidewall spacers adjacent to the mutual graded junction.

16. The method of claim 15, wherein said etching at least part of the lower portions reduces the angle by which the lower outer surfaces of the sidewall spacers adjacent to the mutual graded junction taper away from the transistor gate structure.

17. The method of claim 16, wherein after said etching at least part of the lower portions of the sidewall spacers adjacent to the mutual graded junction, the lower outer surfaces adjacent to the mutual graded junction taper away from the transistor gate structure by an angle less than the lower outer surfaces distal from the mutual graded junction.

18. The method of claim 15, wherein the mutual graded junction comprises inner portions arranged underneath a portion of the sidewall spacers of each of the transistor gate structures and an outer portion laterally adjacent to the inner portions, and wherein a first concentration of dopant within the outer region is substantially greater than a second concentration of dopant within the inner regions.

19. The method of claim 18, wherein the layer immediately beneath the dielectric is an etch stop layer arranged above the sidewall spacer and the mutual graded junction, and wherein said etching a portion of the dielectric comprises etching the dielectric selectively relative to a material within the etch stop layer.

20. The method of claim 19, wherein the dielectric comprises silicon dioxide and etch stop layer comprises silicon nitride, and wherein said etching a portion of the dielectric further comprises etching the dielectric using an etch technique selective to silicon dioxide over silicon nitride.

\* \* \* \* \*